United States Patent
Chen et al.

(10) Patent No.: US 10,972,111 B2
(45) Date of Patent: Apr. 6, 2021

(54) PHASE-LOCKED LOOP CIRCUIT

(71) Applicant: ams AG, Premstaetten (AT)

(72) Inventors: Jia Sheng Chen, Premstaetten (AT); Gregor Schatzberger, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/635,284

(22) PCT Filed: Jul. 31, 2018

(86) PCT No.: PCT/EP2018/070748
§ 371 (c)(1),
(2) Date: Jan. 30, 2020

(87) PCT Pub. No.: WO2019/025447
PCT Pub. Date: Feb. 7, 2019

(65) Prior Publication Data
US 2020/0373928 A1    Nov. 26, 2020

(30) Foreign Application Priority Data
Aug. 2, 2017 (EP) .................................. 17184454

(51) Int. Cl.
*H03L 7/06* (2006.01)
*H03L 7/10* (2006.01)
*H03L 7/099* (2006.01)

(52) U.S. Cl.
CPC .............. *H03L 7/102* (2013.01); *H03L 7/099* (2013.01)

(58) Field of Classification Search
CPC .................... H03L 7/099; H03L 7/102

USPC .......................................................... 327/156
See application file for complete search history.

(56) References Cited

U.S. PATENT DOCUMENTS

| 5,382,922 A * | 1/1995 | Gersbach ................ H03L 1/00 331/1 A |
| 5,610,560 A * | 3/1997 | Sauer .................... H03L 7/0991 331/11 |
| 5,923,196 A * | 7/1999 | Okamoto .................. H03K 3/03 327/147 |

(Continued)

OTHER PUBLICATIONS

European Patent Office, International Search Report for PCT/EP2018/070748 dated Sep. 5, 2018.

*Primary Examiner* — Ryan Jager
(74) *Attorney, Agent, or Firm* — MH2 Technology Law Group LLP

(57) ABSTRACT

A phase-locked loop circuit comprises an oscillator having a plurality of operating curves and being suitable for generating an output signal. In a calibration state the oscillator is trimmed to an operating curve for use in a normal operation state. The phase-locked loop circuit further comprises a phase/frequency detector being suitable for generating at least one error signal based on an input signal and a feedback signal generated on the basis of the output signal. The phase-locked loop circuit further comprises a loop filter being suitable for generating a loop-filter signal based on the at least one error signal, the loop-filter signal being applied to the oscillator in the normal operation state. The phase-locked loop circuit further comprises a calibration circuit being suitable for trimming the oscillator to the operating curve for use in the normal operation state on the basis of the at least one error signal.

14 Claims, 9 Drawing Sheets

(56) References Cited

U.S. PATENT DOCUMENTS

| | | | |
|---|---|---|---|
| 5,942,949 A | 8/1999 | Wilson et al. | |
| 6,091,304 A * | 7/2000 | Harrer | H03L 7/10 |
| | | | 331/10 |
| 6,683,502 B1 * | 1/2004 | Groen | H03L 7/0891 |
| | | | 331/16 |
| 6,859,073 B1 | 2/2005 | Dai et al. | |
| 6,870,411 B2 * | 3/2005 | Shibahara | H03L 7/0891 |
| | | | 327/156 |
| 7,061,288 B2 * | 6/2006 | Burgess | H03L 7/099 |
| | | | 327/156 |
| 7,154,348 B2 * | 12/2006 | Lee | H03L 7/085 |
| | | | 331/34 |
| 7,495,488 B2 * | 2/2009 | Kim | H03L 7/0812 |
| | | | 327/141 |
| 8,509,372 B1 * | 8/2013 | Zhang | H03L 7/093 |
| | | | 375/376 |
| 2005/0083137 A1 | 4/2005 | Lee et al. | |
| 2007/0205816 A1 | 9/2007 | Kim | |

* cited by examiner

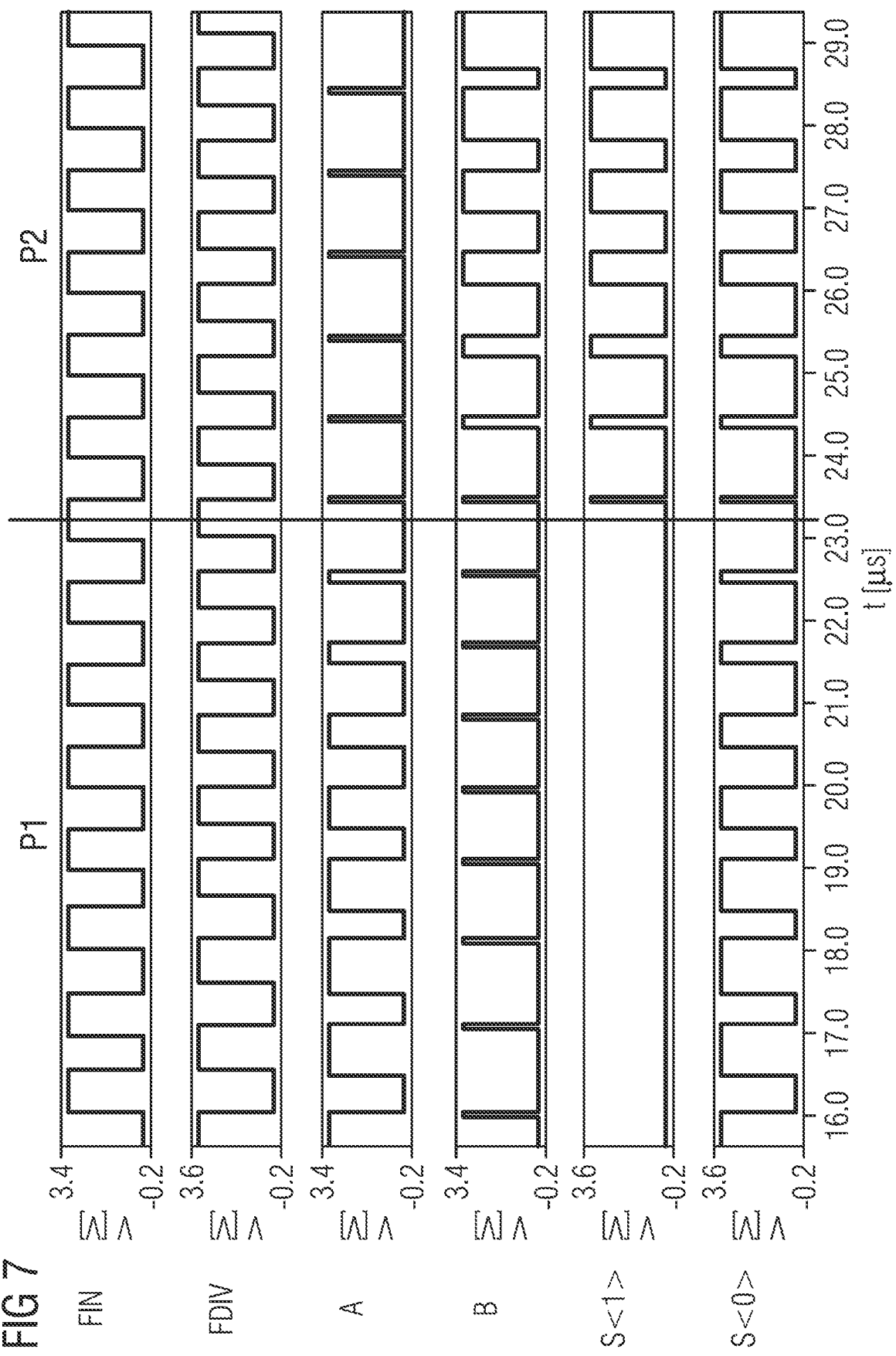

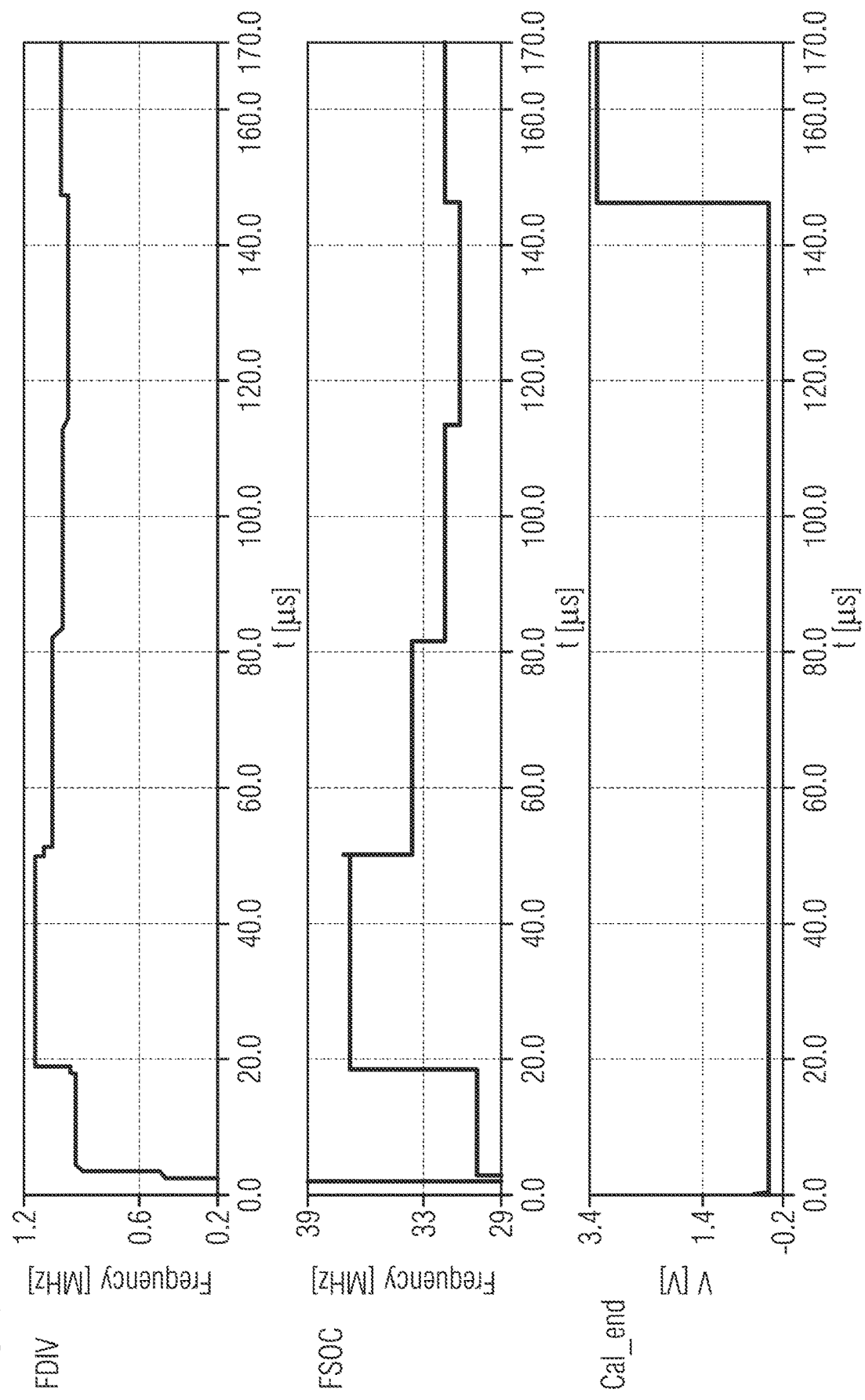

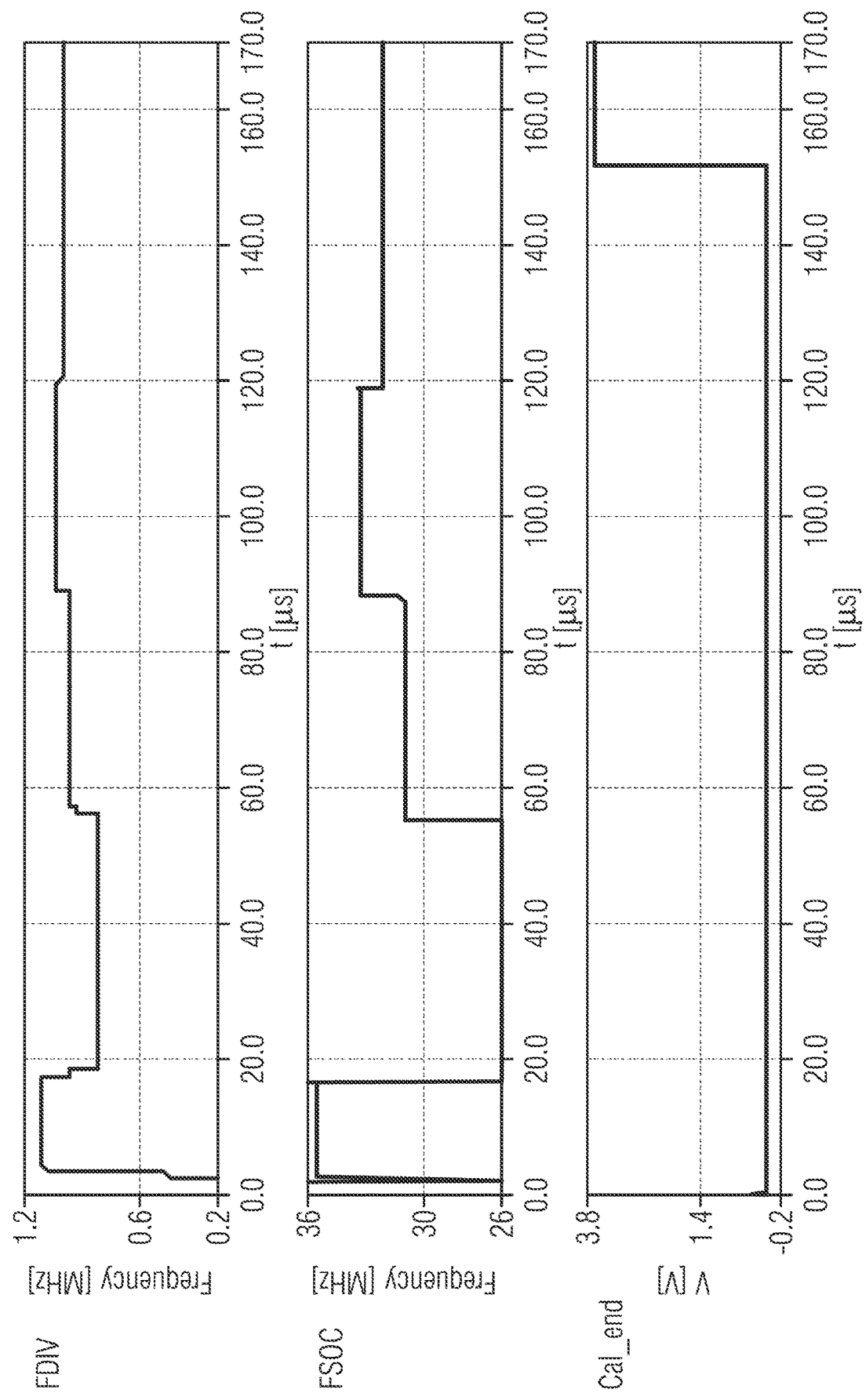

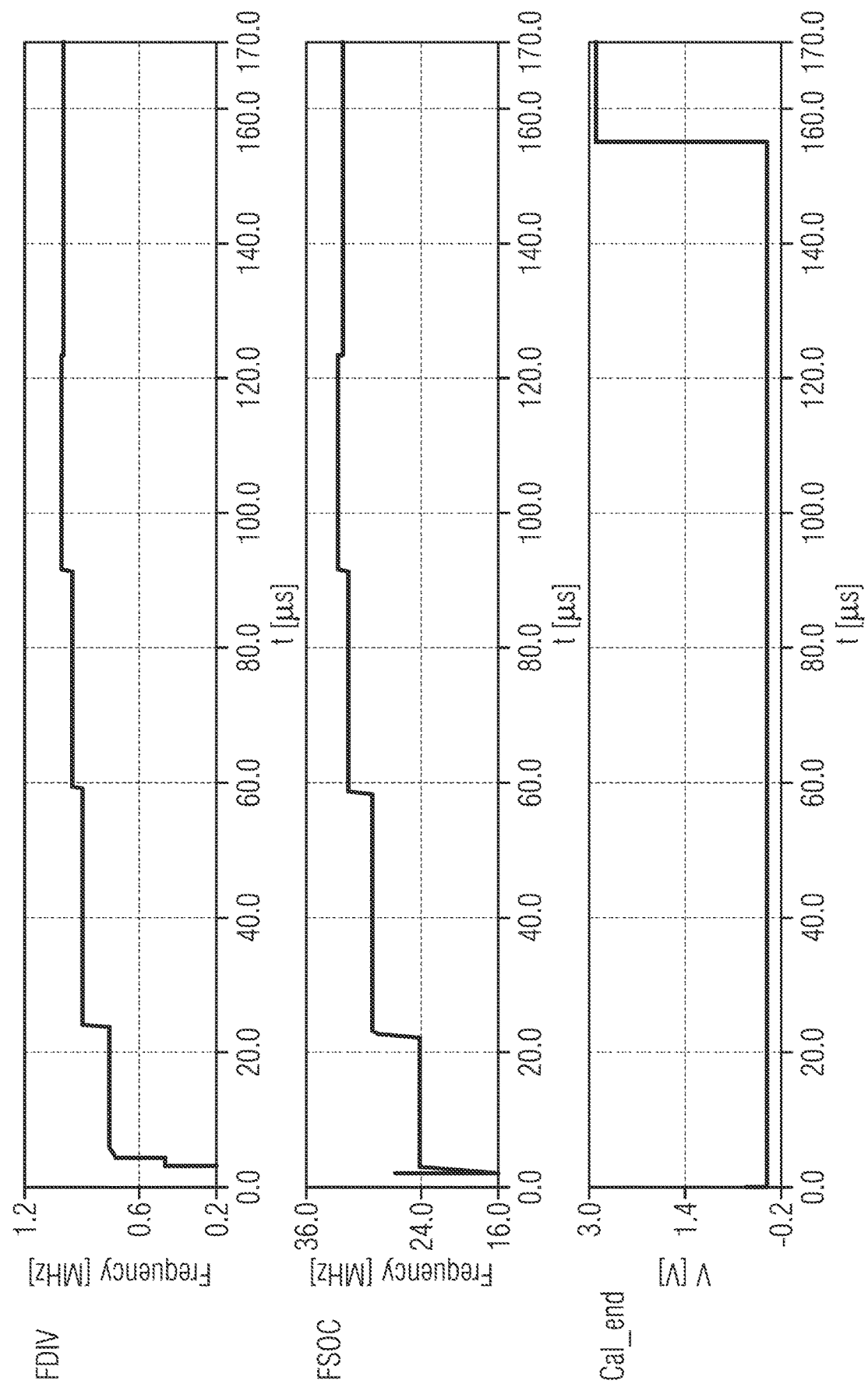

PHASE-LOCKED LOOP CIRCUIT

The disclosure relates to a phase-locked loop circuit comprising an oscillator that may be trimmed during a calibration state.

BACKGROUND

A voltage-controlled oscillator, also abbreviated as VCO, is an electronic oscillator whose oscillation frequency is controlled by a voltage input. A VCO may be part of a phase-locked loop, also abbreviated as PLL, which is a control system generating an output signal whose phase is related to the phase of an input signal.

Voltage-controlled oscillator characteristic curves, also referred to as operating curves, may vary from VCO to VCO due to variations in device fabrication. For example, operating curves, as shown as examples in FIG. 3, can shift up or down, to the right or left, and even have differing slopes. Nor are they all necessarily linear. As a result, for some applications, the VCOs in different PLLs may need to be trimmed with different digital control input values N to select the appropriate VCO operating curve for a desired output frequency.

Conventionally, each VCO is tested in the factory to characterise its set of operating curves to pre-determine which digital control input values are appropriate for different desired output frequencies. When a particular VCO is selected for a particular application, the appropriate trim setting (i.e. the particular digital control input value N that corresponds to the desired output frequency) is permanently burned into the device, e.g. by blowing fuse links. This factory testing and hard-wiring of the VCO adds to the costs of manufacturing the PLL. It also limits the operating frequency range of each PLL to the permanently selected operating curve.

Alternatively, a self-calibrated oscillator may be provided. U.S. Pat. No. 6,859,073B1 to Dai, et al. describes a self-calibrating phase-locked loop design using two counters and a state machine to achieve self-calibration.

U.S. Pat. No. 5,942,949A to Welson, et al. describes two ways to achieve self-calibrating phase-locked loops. One is using a state machine and a timer to fulfil the self-calibration function. Another one is using a dual path to realise the self-calibration. In this document, a trimmable phase-locked loop uses a state machine, a timer and an inverter. The basic aspect of this implementation is that an oscillator having a plurality of operating curves is designed for the PLL. During PLL self-calibrating operations, the oscillator is automatically trimmed to an appropriate oscillator operating curve for use during normal PLL operations. In particular embodiments, the PLL is a charge-pump PLL comprising a phase/frequency detector, also abbreviated as PFD, that generates error signals based on comparing an input signal and a PLL feedback signal, a charge pump, which generates amounts of charge corresponding to the error signals, a loop filter, which accumulates the amounts of charge to generate a loop-filter voltage, and a voltage-controlled oscillator, where the VCO output signal is used to generate the PLL feedback signal. During normal PLL operations, the loop-filter voltage is applied to the voltage input of the VCO. During the PLL self-calibrating operations, switches arranged in the loop filter and between the loop filter and the VCO are open and a switch arranged between the VCO and a reference voltage is closed. Under this setup, a state machine applies a sequence of digital control input values to the VCO to select different VCO operating curves until an appropriate operating curve for the present PLL application is found. In different embodiments, the state machine uses different signals to determine whether the centre frequency of each operating curve in the sequence is above or below the desired nominal operating frequency for the VCO, and selects one such operating curve for use in normal operations. Since the VCO is not permanently trimmed, the PLL can be used and then re-used for different applications, operating at different nominal frequencies. Each time the PLL is powered up, the VCO will be trimmed to the current appropriate trim setting. In addition, the PLL self-calibrating operations may be repeated whenever an appropriate reset signal is applied to the PLL. This calibration can be fulfilled by another, different topology also mentioned in the document. The drawback of these designs is that a certain period of time is needed for the charge pump to charge the low-pass filter or that an additional phase/frequency detector is needed during the calibration process.

In order to remedy the drawbacks mentioned above, an improved phase-locked loop circuit is provided.

SUMMARY

The phase-locked loop circuit comprises:
- an oscillator having a plurality of operating curves and being suitable for generating an output signal, wherein, in a calibration state the oscillator being trimmed to an operating curve for use in a normal operation state,
- a phase/frequency detector being suitable for generating at least one error signal based on an input signal and a feedback signal which is generated on the basis of the output signal,
- a loop filter being suitable for generating a loop-filter signal based on the at least one error signal, the loop-filter signal being applied to the oscillator in the normal operation state,
- a calibration circuit being suitable for trimming the oscillator to the operating curve for use in the normal operation state on the basis of the at least one error signal.

The oscillator is an electronic circuit that produces a periodic, oscillating electronic signal having a frequency; the signal may be a sine wave or a square wave signal. The oscillator may be a voltage-controlled oscillator whose oscillation frequency is controlled by a voltage input. In the normal operation mode the phase/frequency detector compares the phase of the output signal with the phase of an input signal, adjusting the oscillator to keep the phases matched. The loop filter determines loop dynamics and should govern stability of the loop; its output signal controls the oscillator in the normal operation mode. The calibration circuit is a self-calibration circuit automatically trimming the oscillator to an appropriate oscillator operating curve for use in the normal operation state. In the calibration state, calibration is performed on the basis of the at least one error signal, which indicates whether the frequency of the output signal, which corresponds to a centre frequency of one operating curve, and the one of the input signal match. It should be mentioned that such a frequency match may be detected on the basis of varying phase shifts between the signals.

The phase-locked loop circuit as proposed provides advantages over conventional PLLs. Since the VCO is trimmed automatically to the appropriate operating curve at power up, there is no need to trim the VCO in the factory. Nor is there any need to keep an inventory of different VCOs for different applications, since each VCO will automatically be trimmed to the appropriate trim setting for the particular application. In addition, since the VCO is not permanently trimmed, the PLL can be used and then re-used for different applications, operating at different nominal frequencies. Each time the PLL is powered up, the VCO will be trimmed to the current appropriate trim setting. In addition, the PLL self-calibrating operations may be repeated whenever an appropriate reset signal is applied to the PLL.

Another advantage of the proposed phase-locked loop circuit is that very few additional components need to be added to the conventional design of the PLL to achieve the self-calibrating PLL as proposed, which avoids the risk of adversely affecting the sensitive analogue loop performance.

For avoiding the need to use an additional phase/frequency detector, the proposed phase-locked loop circuit directly uses the PLL's phase/frequency detector only to achieve self-calibration.

The approach to use the error signal as a basis of trimming enhances the efficiency of the self-calibration process. With this new self-calibration topology, both sequential search and binary search can be implemented, which provides flexibility for customised applications. Furthermore, the whole circuit may be entirely implemented by digital circuits, avoiding to adversely affect sensitive analogue parts of the whole PLL system. The inventive PLL circuit may be comprised by an integrated circuit.

One embodiment of the phase-locked loop circuit further comprises a feedback divider being suitable for providing the feedback signal, the output signal being applied to the feedback divider. Such a divider in the feedback path or in a reference path, or both, may make the output signal frequency a multiple of the reference frequency of the input signal.

The phase-locked loop circuit optionally comprises a first switch coupled between the loop filter and the oscillator, the first switch being in a conductive state during the normal operation state and being in a non-conductive state during the calibration state. A second switch is coupled between the oscillator and a circuit or terminal for providing a reference signal, the second switch being in a non-conductive state during the normal operation state and being in a conductive state during the calibration state. The first and second switches allow to switch between the normal operation state's configuration and the calibration state's configuration.

The at least one error signal may comprise a first error signal and a second error signal. The first error signal indicates whether and to what extent one of the feedback signal and the input signal lags the other one of the feedback signal and the input signal. The second error signal indicates whether and to what extent one of the feedback signal and the input signal leads the other one of the feedback signal and the input signal. In other words, the error signals indicate leading and lagging of the feedback signal with respect to the input signal or vice versa.

The calibration of the PLL directly uses the error signals of the phase/frequency detector to execute calibration instead of conventionally using a low-pass filter charged voltage or an additional path.

For eliminating a period of waiting time due to charging the low-pass filter, the proposed phase-locked loop circuit directly uses the error signals, which may be referred to as up and down pulse signals of the phase/frequency detector, instead of using a settling voltage of a low-pass filter to achieve self-calibration.

The calibration circuit may comprise a state machine being suitable for providing a sequence of control words to the oscillator and selecting a trim setting for the oscillator, wherein the selected control word best suits the desired operation of the oscillator. The state machine searches the optimum trim setting, which may be performed by a binary search or a linear search, for example. The state machine may select the trim setting on the basis of whether one of the feedback signal and the input signal leads the other one of the feedback signal and the input signal or whether one of the feedback signal and the input signal lags the other one of the feedback signal and the input signal. Leading or lagging indicates the search direction to the state machine.

In one embodiment, a sampling means is coupled upstream of the state machine, the sampling means being suitable for providing a sampled signal indicating whether one of the feedback signal and the input signal leads the other one of the feedback signal and the input signal or whether one of the feedback signal and the input signal lags the other one of the feedback signal and the input signal. Providing only sampled values may include information loss. However, in the period between two sampled values the circuit may settle, which allows proper convergence of the trimming process.

An encoder is coupled upstream of the sampling means. The at least one error signal is applied to the encoder in the calibration state. The encoder provides an encoder signal indicating whether one of the feedback signal and the input signal leads the other one of the feedback signal and the input signal or whether one of the feedback signal and the input signal lags the other one of the feedback signal and the input signal. The encoder further provides a signal which forms the basis for triggering sampling and is applied to a signal generator triggering sampling.

The encoder has a first encoder input, a second encoder input, a first encoder output and a second encoder output, the first encoder output providing a logical HIGH signal if a logical HIGH signal is applied to either the first encoder input or the second encoder input, the second encoder output providing a logical HIGH signal if a logical HIGH signal is applied to a given one of the first and second encoder inputs. In all other cases, the first and second encoder output signals are LOW. The signal generator is coupled to the first encoder output. The signal generator is suitable for providing a signal on the basis of an applied signal in such a manner that it is delayed and has a larger pulse interval. Thus, the signal generator, which may be a clock generator, may serve as a counter, ensuring that signals are sampled in appropriate intervals, which allows proper settling of the circuit after adjusting the VCO, thereby providing proper signals which form the basis of the next adjustment step.

The sampling means may comprise a D flip-flop for sampling the signal provided at the second encoder output, the D flip-flop serving as a sample-and-hold element.

A first multiplexer and a second multiplexer may be coupled upstream of the first and second encoder inputs, respectively. In the calibration state, the first and second multiplexers provide the first and second error signals, respectively. In the normal operation state or before calibration the multiplexers may provide a given value for re-setting the calibration circuit into a well-defined state.

The phase-locked loop circuit is suitable for switching to the calibration state in response to a start signal, wherein the first switch switches to the non-conductive state, the second switch switches to the conductive state, and the calibration circuit, in particular the state machine, starts trimming. Furthermore, the multiplexers apply the error signals to the encoder.

The phase-locked loop circuit is suitable for switching to the normal operation state in response to an end signal, wherein the first switch switches to the conductive state, the second switch switches to the non-conductive state, and the selected trimming set is fixed for use in the normal operation state. Furthermore, the multiplexers reset the calibration circuit by applying given values.

The phase-locked loop circuit may be used in audio-chips for data transfer. It may be used in optical devices which allow measuring distances, which requires a precise high speed clock. An ANC chip may also need a precise high speed clock. Applications where time is a reference for the application having a higher clock speed which cannot be served by an on chip oscillator may need a precise PLL as described. Further fields of use of the phase-locked loop circuit are medical devices and the automotive sector.

BRIEF DESCRIPTION OF THE DRAWINGS

Non-limiting, exemplary embodiments of the phase-locked loop circuit will now be described with reference to the accompanying drawings, in which:

FIG. 7 shows a time diagram of signals in the calibration state.

FIGS. 9A, 9B and 9C show feedback signals, frequencies of output signals and end signals.

DETAILED DESCRIPTION

Figure 1:
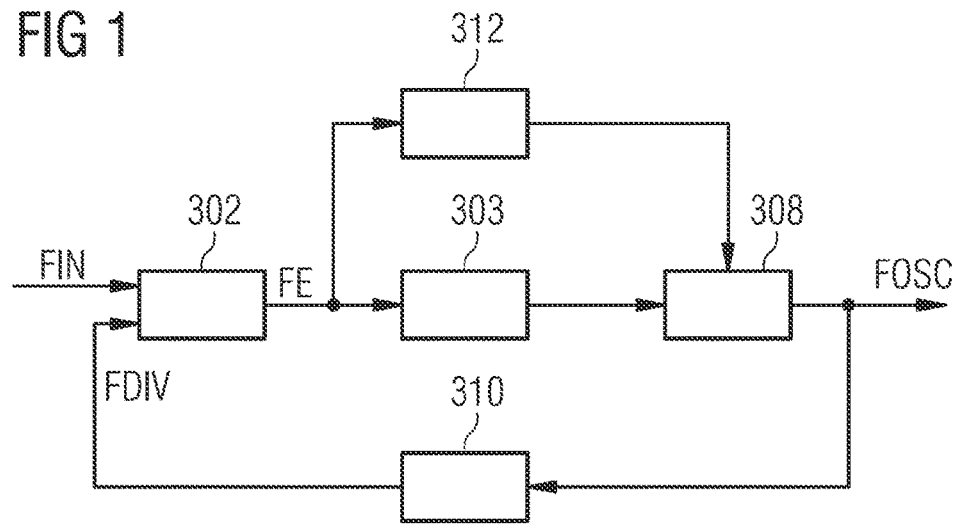
FIG. 1 shows a block diagram of an embodiment of a phase-locked loop circuit.

FIG. 1 shows a block diagram of an embodiment of a phase-locked loop circuit comprising a voltage-controlled oscillator 308, abbreviated VCO, which is suitable for generating a periodic output signal FOSC. A loop filter 303 is coupled upstream of the VCO 308. A phase/frequency detector 302 is coupled upstream of the loop filter 303. A feedback loop couples the output signal FOSC via an optional feedback divider 310 to the phase/frequency detector 302, thereby applying a feedback signal FDIV to the phase/frequency detector 302. During a normal operation mode the oscillator 308 generates a periodic signal, and the phase/frequency detector 302 compares the phase of the output signal FOSC, more precisely the one of the feedback signal, with a phase of a periodic input signal FIN and generates at least one error signal FE indicating the phase difference between the input signal FIN and the feedback signal FDIV. The oscillator 308 is adjusted via the loop filter 303, to which the at least one error signal FE is applied, to keep the phases matched.

Furthermore, the phase-locked loop circuit comprises a calibration circuit 312, also referred to as self-calibration circuit, that is suitable for trimming the oscillator 308 for use in the normal operation state on the basis of the at least one error signal FE. Trimming is performed during a calibration state before the normal operation state.

Figure 2:
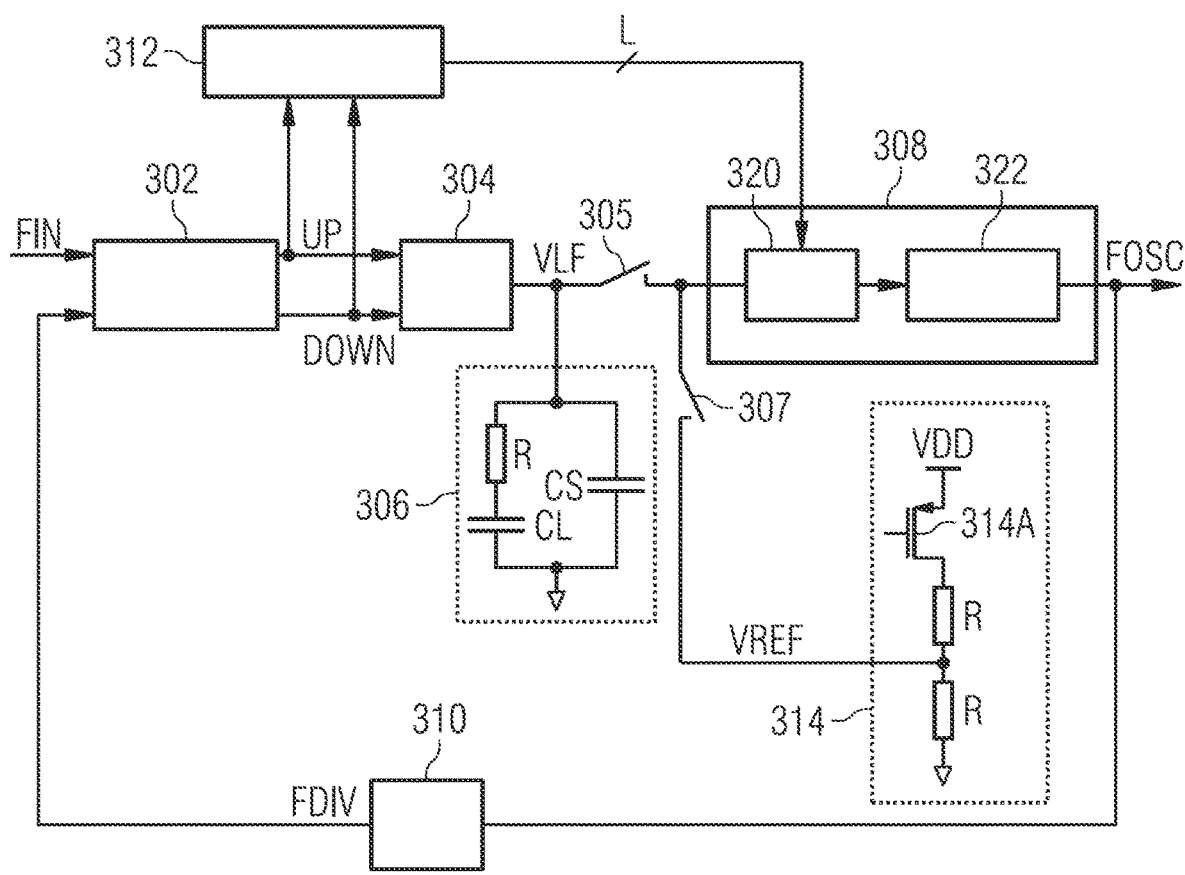
FIG. 2 shows a detailed block diagram of an embodiment of a phase-locked loop circuit.

FIG. 2 shows a detailed block diagram of an embodiment of a phase-locked loop circuit, which is a charge-pump phase-locked loop circuit, including a phase/frequency detector 302, a charge pump 304, a low-pass filter 306, a voltage-controlled oscillator 308 comprising a trimming circuit 320 and a current-controlled oscillator 322, a feedback divider 310 and a calibration circuit 312; the latter may also be considered as a self-calibration circuit.

The charge pump 304 is coupled downstream of the phase/frequency detector 302. The low-pass filter 306 is coupled downstream of the charge pump 304 and upstream of the trimming circuit 320 and the downstream current-controlled oscillator 322. A feedback loop couples an output signal FOSC of the current-controlled oscillator 322 via the feedback divider 310 to the phase/frequency detector 302, to which also an input signal FIN is applied. The calibration circuit 312 is coupled between outputs of the phase/frequency detector 302 and the trimming circuit 320. A first switch 305 is arranged between the low-pass filter 306 and a trimming circuit's 320 input. A second switch 307 is located between the trimming circuit's 320 input and a circuit 314 for providing a reference voltage, which comprises a voltage divider formed by voltage divider resistors R and a power-down switch 314A coupled in series to the resistors R.

The output signal FOSC is applied to the feedback divider 310, which provides a feedback signal FDIV having a frequency that is a fraction of the frequency of the output signal FOSC. The feedback signal FDIV as well as the input signal FIN are fed to the phase/frequency detector 302, which provides a first error signal UP and a second error signal DOWN indicating differences between the feedback signal FDIV and the input signal FIN. The first error signal UP indicates whether and to what extent the feedback signal FDIV lags the input signal FIN. The second error signal DOWN indicates whether and to what extent the feedback signal FDIV leads the input signal FIN.

The charge pump 304, to which the first and second error signals UP, DOWN is applied, and the downstream low-pass filter 306 form a loop filter. The low-pass filter 306 has a relatively simple design, comprising a capacitor CS in parallel with the series combination of a resistor R and a relatively large capacitor CL, forming a second order filter. As such, the low-pass filter 306 operates as an integrator that accumulates the net charge from the charge pump 304. Other, more sophisticated loop filters are of course also possible. The charge pump 304 drives a loop filter voltage VLF at the low-pass filter output in dependency of the first and second error signals UP, DOWN.

The voltage-controlled oscillator 308 comprises the current-controlled oscillator 322 and the upstream trimming circuit 320. The current-controlled oscillator 322 can be designed as a conventional ring oscillator or other type of oscillator. The trimming circuit 320 of the voltage-controlled oscillator 308 can be any kind of a digital-to-analogue converter, abbreviated DAC.

The phase-locked loop circuit comprises two switches 305 and 307. These switches 305, 307 are designed to switch the trimming operation and the normal PLL operation. During the trimming operation, referred to as the calibration state, the VCO 308 will be trimmed to have an appropriate characteristic curve. After the trimming operation is done, the PLL starts to operate in a normal operation, referred to as the normal operation state.

The first switch 305 coupled downstream of the low-pass filter 306 connects the latter to the VCO 308 in a conductive state. This is the case in the normal operation state, which allows to apply the loop filter voltage VLF to the VCO 308, thereby controlling the latter. In the calibration state the first switch 305 is in a non-conductive state. The second switch 307 is in a non-conductive state in the normal operation state and is in a conductive state in the calibration state, which allows applying a reference voltage VREF to the VCO 308 and calibrating it.

During the trimming operation, the first switch 305 is open and the second switch 307 is closed. The reference voltage VREF is always applied to a voltage input of the VCO 308 rather than the loop-filter voltage VLF. The reference voltage VREF is a nominal centre voltage of the VCO input voltage range over which the VCO 308 is designed to operate. Usually this value is set to half of a supply voltage VDD. This reference voltage VDD/2 can easily be provided by an on-chip circuit or an circuit outside of the chip which includes the circuit with the PLL. In this embodiment, the reference voltage is designed as part of the trimming circuit as shown in FIG. 2. It can easily be observed that the voltage divider 314 is designed by two high-density resistors R with the benefits of not consuming much space. An alternative solution could be a voltage divider realised with transistors (not shown). To save power in the normal operation, the voltage divider 314 is designed with the power-down switch 314A. The circuit serves as a reference voltage generator powered down in the normal operation state and only powered up during the trimming operation.

The calibration circuit 312 is arranged in such a manner that the error signals UP, DOWN are applied to the calibration circuit 312. The calibration circuit 312 controls the trimming circuit 320 of the VCO 308, thereby trimming the VCO 308 for use in the normal operation mode.

Figure 3:
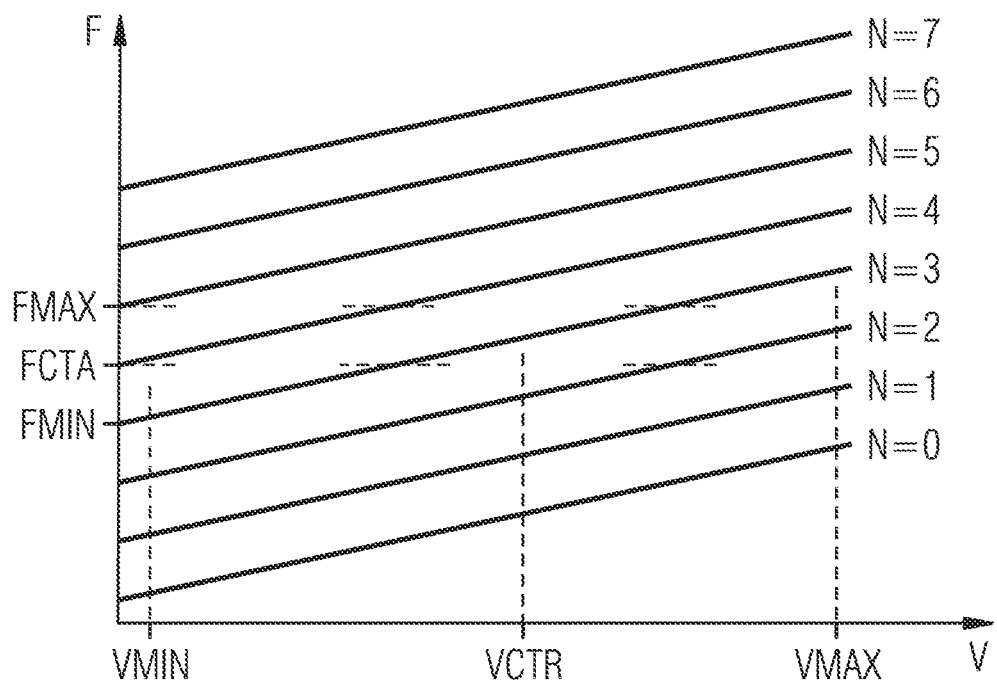
FIG. 3 shows exemplary characteristic curves of an embodiment of a voltage-controlled oscillator.

FIG. 3 shows exemplary characteristic curves also referred to as operating curves of the voltage-controlled oscillator 308 of FIG. 2. The VCO 308 has a plurality of VCO input voltage V versus output frequency F operating curves. Calibration, also known as VCO trimming, includes choosing a VCO operating curve having a centre frequency VCTR to encompass the desired range of VCO operation. The frequency range is a portion of the operating range of the VCO ranging from FMAX to FMIN and depending on the voltage range from VMAX to VMIN.

Figure 4:
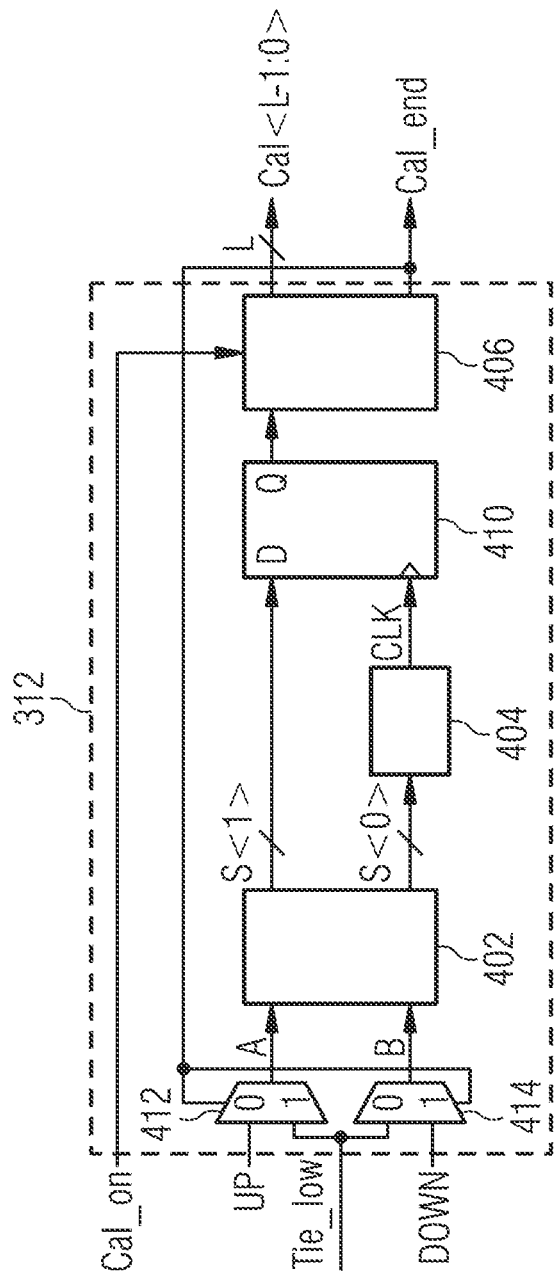
FIG. 4A shows a detailed block diagram of an embodiment of a calibration circuit.
FIG. 4B shows an encoder table.

FIG. 4A shows a detailed block diagram of the calibration circuit 312. It is a digital circuit which only operates during the self-calibrating operation, i.e. in the calibration state. The calibration circuit 312 comprises an encoder 402, a clock generator 404, a D flip-flop 410, two multiplexers 412, 414 and a state machine 406.

The encoder 402 has a first encoder input, a second encoder input, a first encoder output providing a first encoder output signal S<0> and a second encoder output providing a second encoder output signal S<1>. A first encoder input signal A is applied at the first encoder input. A second encoder input signal B is applied at the second encoder input. The first and second encoder output signals S<0>, S<1> depend on the first and second encoder input signals A, B. The signals A, B, S<0>, S<1> are logical signals having either a HIGH state/logical 1, e.g. corresponding to a high voltage level, or a LOW state/logical 0, e.g. corresponding to a low voltage level.

FIG. 4B shows an encoder table indicating the states of the signals A, B, S<0>, S<1>. If the first and second encoder input signals A, B are the same, i.e. the encoder input signals A, B are either both logical 0 or both logical 1, the first and second encoder output signals S<0>, S<1> are logical 0. If the first and second encoder input signals differ, i.e. one of the encoder input signals A, B is logical 0 and the other one is logical 1, the first encoder output signal S<0> is logical 1. Only if the first encoder input signal A is logical 0 and the second encoder input signal B is logical 1, the second encoder output signal S<1> is logical 1. This combination occurs when the feedback signal FDIV leads the input signal FIN, which is indicated by P2. If the first encoder input signal A is logical 1 and the second encoder input signal B is logical 0, the second encoder output signal S<1> is logical 0. This combination occurs when the feedback signal FDIV lags the input signal FIN, which is indicated by P1.

Back to FIG. 4A, a first multiplexer 412 providing the first encoder input signal A is coupled upstream of the first encoder input. A second multiplexer 414 providing the second encoder input signal B is coupled upstream of the second encoder input. The first error signal UP is applied to the first multiplexer 412. The second error signal DOWN is applied to the second multiplexer 414. Furthermore, a signal Tie_low having a given state is applied to the first and second multiplexers 412, 414. Each of the first and second multiplexers 412, 414 is suitable for selecting one of its input signals and providing it at its output. In the calibration state, the first and second multiplexers 412, 414 provide the first and second error signals UP, DOWN as first and second encoder input signals A, B. In the normal operation state, the outputs of the first and second multiplexers 412, 414 are tied to the given state Tie_low.

The first encoder output signal S<0> is applied to the clock generator 404, which generates a clock signal CLK having a lower frequency than the first encoder output signal S<0>. The second encoder output signal S<1> is applied to an input D of the D flip-flop 410 triggered by the clock signal CLK. When being triggered, the input signal D is provided at an output Q of the D flip-flop 410. Thus the D flip-flop 410 provides a sample-and-hold function. The output signal of the D flip-flop 410 is applied to a state machine 406 suitable for generating a control word Cal<L-1:0> of L bits being applied to to the trimming circuit 320. The state machine 406 generates a sequence of control words Cal<L-1:0> provided to the VCO 308 to sequentially select different VCO operating curves until an appropriate one for normal use is selected. With the reference voltage VREF applied to the VCO 308 for each VCO operating curve the VCO 308 generates an output signal, FOUT, having a constant frequency. If the desired frequency is generated, the control word Cal<L-1:0> is fixed. After finishing calibration, an end signal Cal_end provided by the state machine 406 initiates the normal operation state. The end signal Cal_end also resets the first and second multiplexers 412, 414, whereby the given state Tie_low is applied to the encoder 402, which stops the calibration process of the calibration circuit 312.

Figure 5:
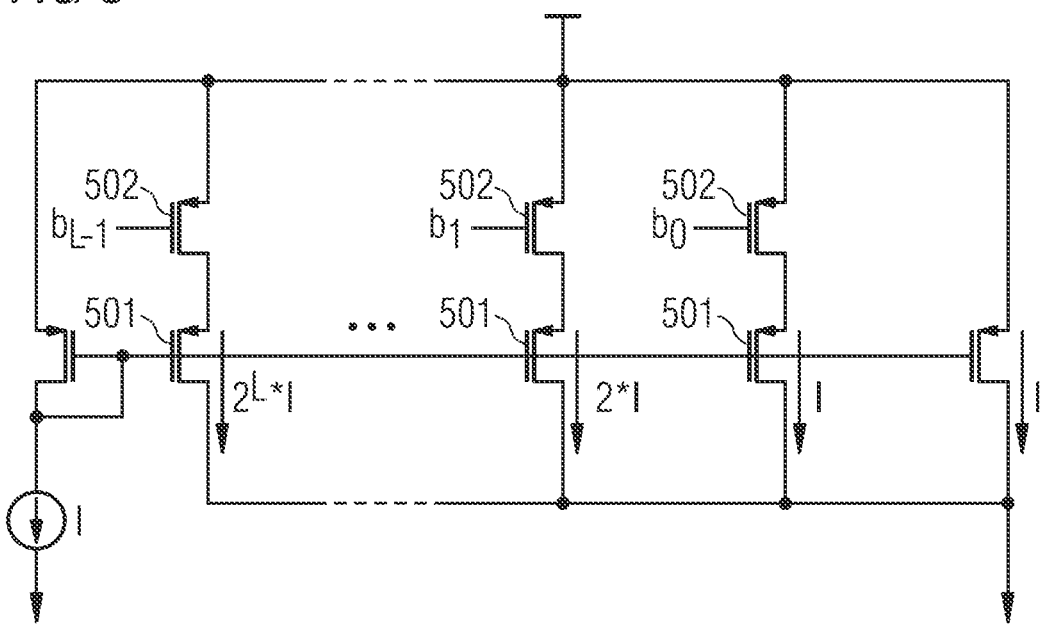
FIG. 5 shows an embodiment of an exemplary digital-to-analogue converter circuit.

FIG. 5 shows an embodiment of an exemplary digital-to-analogue converter circuit embodied as a transistor level design. The DAC circuit serves as the trimming circuit 320 of the voltage-controlled oscillator 308, which nevertheless can be any kind of a DAC circuit.

The circuit comprises a multitude of transistor current sources 501, each coupled in series with an analogue MOSFET switch 502. The branches of transistor current sources 501 and analogue MOSFET switches 502 are coupled in parallel. The branches serve as switchable binary scaled current sources being suitable for providing binary-weighted currents: I, 2*I, 4*I, 8*I, . . . . The circuit provides a current output dependent on a bit sequence $<b_{L-1}, \ldots, b_1, b_0>$ setting the analogue MOSFET switches 502 in correspondence with the bits' states and adding the currents of the branches having a conductive analogue MOSFET switch 502, thereby providing a current corresponding to the bit sequence <$b_{L-1}$, . . . , $b_1$, $b_0$>.

Figure 6:
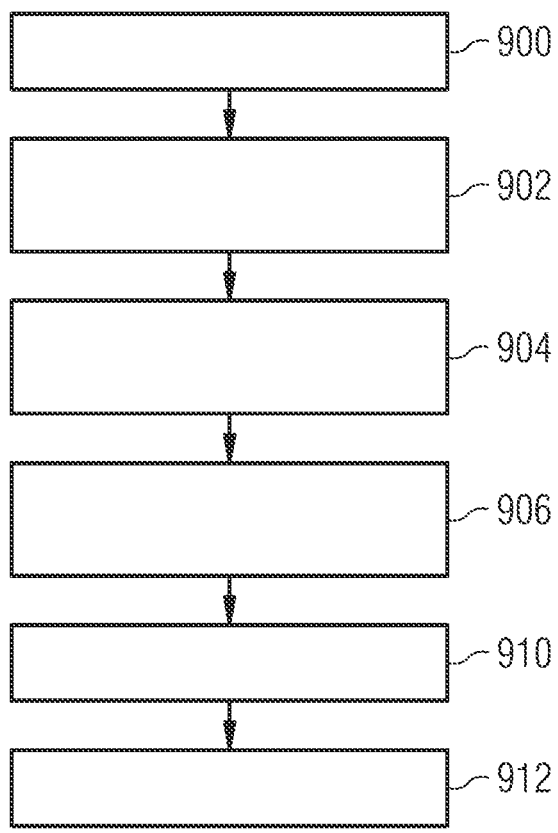
FIG. 6 shows steps of an exemplary calibration process.

FIG. 6 shows steps of an exemplary calibration process. FIG. 6 shows the procedure from the calibration phase to normal PLL operation.

In a first step 900, which may be referred to as "power up/cal signal", the trimming process starts. Each time the PLL is powered up, commencement of calibration is triggered by a signal, e.g. the start signal Cal_on.

In a second step 902, which may be referred to as "configure switches for VCO centre frequency calibration", the first and second switches 305, 307 are set to the non-conductive state and the conductive state, respectively, which allows to calibrate the centre frequency of the VCO 308.

In a third step 904, which may be referred to as "perform centre frequency calibration", the calibration process is performed until a suitable control word is found.

In a fourth step 906, which may be referred to as "freeze digital control word L for VCO", the appropriate control setting is fixed.

In a fifth step 910, which may be referred to as "disable calibration circuit; connect loop", the operation of the calibration circuit is stopped and the first and second switches 305, 307 are set to the conductive state and the non-conductive state, respectively, which allows to control operation of the VOC 308 using the feedback loop.

In a sixth step 912, which may be referred to as "phase-lock operation", the PLL circuit works in the normal operation state.

FIG. 7 shows a time diagram of signals in the calibration state. The diagram shows the input signal FIN, the feedback signal FDIV, the first encoder input signal A corresponding to the first error signal UP, the second encoder input signal B corresponding to the second error signal DOWN, the second encoder output signal S<1> and the first encoder output signal S<0> versus time t. In time area P1, the feedback signal FDIV lags the input signal FIN. In time area P2, the feedback signal FDIV leads the input signal FIN.

The above-mentioned time diagram may indicate the calibration process described below. Each time the PLL circuit is powered up, the VCO 308 will be trimmed to the current appropriate trim setting. In addition, the PLL self-calibrating operations may be repeated whenever a reset signal is applied to the PLL.

The calibration is triggered by a rising edge of the start signal Cal_on as shown in FIG. 4A. It opens the first switch 305 and closes the second switch 307, thereby applying the reference signal VREF to the VCO 308. The control input of the trimming circuit 320 is connected to the control word Cal<L-1:0> of the calibration circuit 312. The frequency of the free-running VCO 308 is divided down by the feedback divider 310 to a lower frequency and fed back to the phase/frequency detector 302. The first and second multiplexers 412, 414 are set to provide the first and second error signals UP, DOWN.

When the phase of the feedback signal FDIV leads the phase of the input signal FIN, the port of the phase/frequency detector 302 providing the second error signal DOWN outputs a wider pulse, which is shown in time area P2. On the other hand, when the phase of the feedback signal FDIV lags the phase of the input signal FIN, the port of the phase/frequency detector 302 providing the first error signal UP outputs a wider pulse, which is shown in time area P1.

These pulses are transmitted to the calibration circuit 312 and encoded as shown in FIG. 4B. The encoder 402 encodes the encoder input signals A and B corresponding to the first and second error signals UP and DOWN in the way as shown in the encoder table. The states corresponding to the time areas P1 and P2 are also indicated in the encoder table of FIG. 4B. The first encoder output signal S<0> is a sequence of rectangular pulses indicating the deviation of the feedback signal FDIV from the input signal FIN in either direction. Figuratively speaking, the first encoder output signal S<0> is formed by merging the first and second encoder input signals A, B corresponding to the first and second error signals UP, DOWN. Peaks having no deviation information are eliminated. The second encoder output signal S<1> includes pulses of varying length corresponding to the ones of the second encoder input signal B and indicating whether and to what extent the feedback signal FDIV leads the input signal FIN. Peaks having no deviation information are eliminated. In FIG. 7, the timing diagrams of UP and DOWN pulses generation can be observed with the corresponding encoding scheme.

Figure 8A:
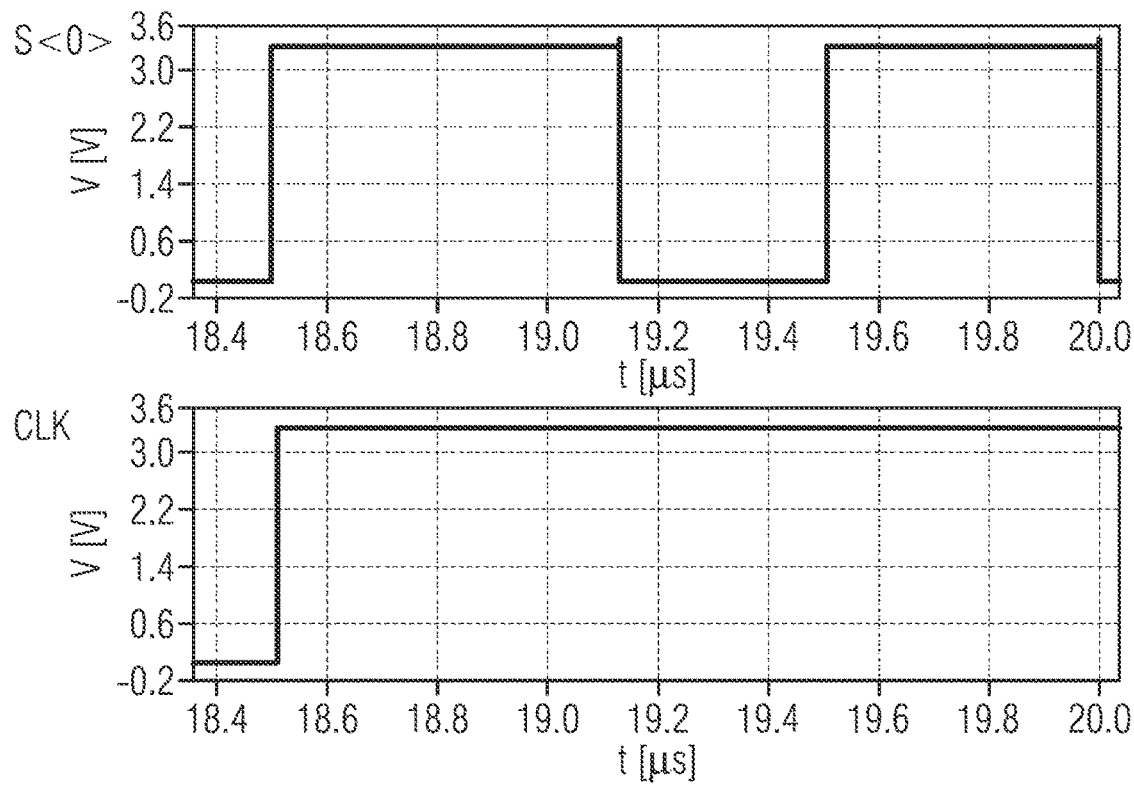
FIGS. 8A and 8B show first encoder output signals and clock signals.
Figure 8B:
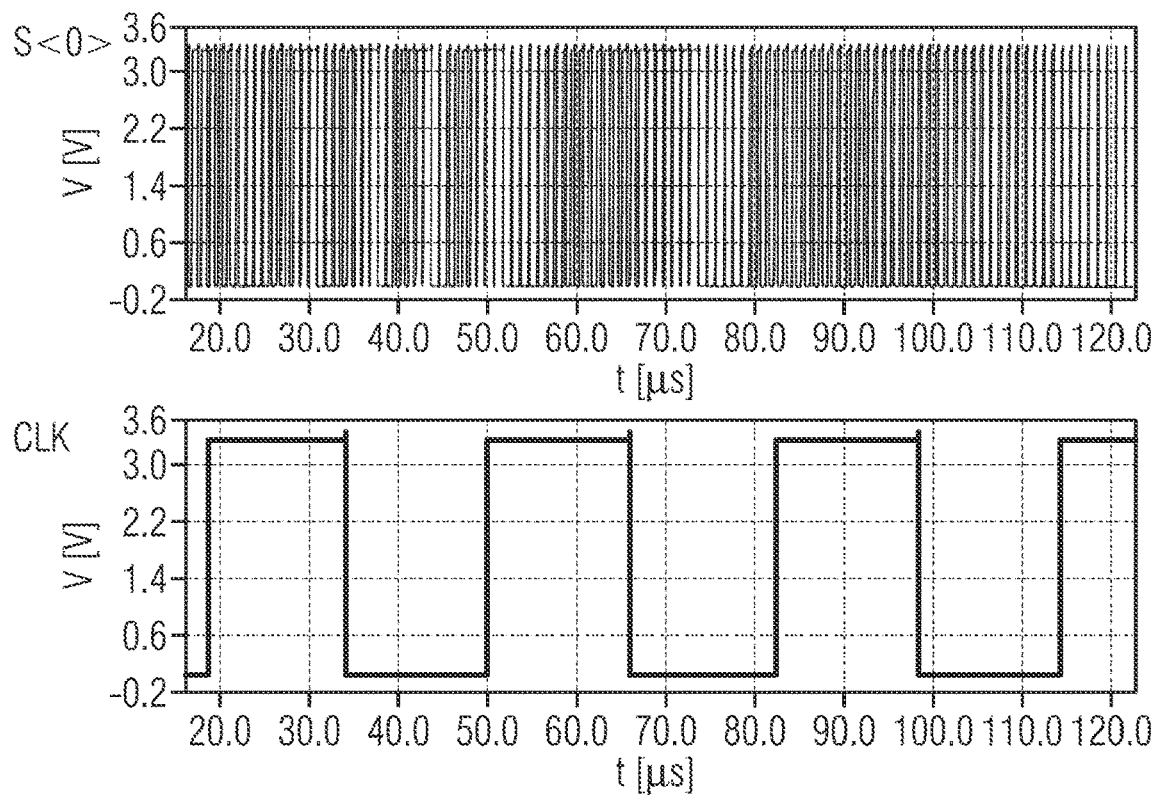

FIGS. 8A and 8B show the first encoder output signal S<0> and the clock signal CLK, FIG. 8A showing a time section of FIG. 8B in an enlarged manner.

The first encoder output signal S<0>, being the encoder's lower output bit, is delayed and divided by the clock generator to provide a new pulse of the clock signal CLK for triggering sampling. FIGS. 8A and 8B show the CLK signal, which is a delayed and divided version of first encoder output signal S<0> generated by the clock generator 404. The resulting clock signal CLK is delayed with respect to the first encoder output signal S<0> and has a larger pulse interval than it. Here a delay of 8 ns and a division factor 32 are shown. FIGS. 8A and 8B clearly show that the frequency of the clock signal CLK is lower than that of the first encoder output signal S<0>.

The pulse of the clock signal CLK generated by the clock generator 404 is then used to sample the second encoder output signal S<1>, being the encoder's higher output bit, using the D flip-flop 410. The clock generator 404 serves as a timer which allows sampling the second encoder output signal S<1> with a lower frequency than the ones of the signals provided at the encoder's outputs, which gives the VCO 308 time for settling after changing the VCO's frequency and allows proper measurement of the adapted frequency. The slight delay of the clock signal's edge with respect to the first encoder output signal S<0> as well as the second encoder output signal S<1> ensures proper sampling of the information of the second encoder output signal S<1> since the edge occurs when the second encoder output signal S<1> has clearly reached either its HIGH or LOW state.

If the phase of the feedback signal FDIV leads the phase of the input signal FIN, logic HIGH will be sampled. If the phase of the feedback signal FDIV lags the phase of the input signal FIN, logic LOW will be sampled.

Controlled by the sampled logic HIGH or LOW signal, the state machine 406 generates the corresponding L-bits control word, Cal<L-1:0>, to control the trimming circuit 320 of the voltage-controlled oscillator 308. The output frequency of the output signal FOSC of the voltage-controlled oscillator 308 will then be increased or decreased until the desired frequency is achieved. With proper trimming range and resolution defined by the system, the L-bits control word from the state machine 406 can be customised. Besides, the calibration algorithm can be implemented by sequential search or binary search, the latter usually being faster. After the calibration is finished, the end signal Cal_end goes HIGH, disconnecting the self-calibration circuit 312 from the PLL loop. At the same time, the second switch 307 is opened and the first switch 305 is closed. The PLL circuit is then connected to a configuration for normal PLL operation.

FIGS. 9A, 9B, 9C show the self-calibration process using a binary search algorithm under different PVT (process, voltage and temperature) conditions. Here the target VCO centre frequency and FDIV are set to 32 MHz and 1 MHz, respectively. The feedback signal FDIV, the frequency of the output signal FOSC and the end signal Cal_end versus time t are shown. Supply voltage Vdd, process corner and temperature Temp vary from Figure to Figure. FIG. 9A refers to Vdd=3.3V, TT Corner, Temp=27° C. FIG. 9B refers to Vdd=3.6V, FF Corner, Temp=−40° C. FIG. 9C refers to Vdd=2.9V, SS Corner, Temp=125° C. The diagrams show stepwise amendments of the output signal's frequency FOSC in dependence of the feedback signal FDIV. Due to the binary search algorithm, the amendments become smaller with an increasing number of steps.

The scope of protection is not limited to the examples given herein above. The proposed phase-locked loop circuit is embodied in each novel characteristic and each combination of characteristics, which particularly includes every combination of any features which are stated in the claims, even if this feature or this combination of features is not explicitly stated in the claims or in the examples.

The invention claimed is:

1. A phase-locked loop circuit, comprising:
    an oscillator having a plurality of operating curves and being suitable for generating an output signal, wherein, in a calibration state, the oscillator is trimmed to an operating curve for use in a normal operation state,
    a phase/frequency detector being suitable for generating at least one error signal based on an input signal and a feedback signal, which is generated on the basis of the output signal,
    a loop filter being suitable for generating a loop-filter signal based on the at least one error signal, the loop-filter signal being applied to the oscillator in the normal operation state,
    a calibration circuit being suitable for trimming the oscillator to the operating curve for use in the normal operation state on the basis of the at least one error signal, wherein the calibration circuit comprises a state machine being suitable for providing a sequence of control words to the oscillator and selecting a trim setting for the oscillator in the calibration state,
    a sampling means coupled upstream of the state machine, the sampling means being suitable for providing a sampled signal indicating whether one of the feedback signal and the input signal leads the other one of the feedback signal and the input signal or whether one of the feedback signal and the input signal lags the other one of the feedback signal and the input signal, wherein the sampling means comprises a signal generator providing a signal for triggering sampling, the signal having a frequency lower than the frequency of the error signal, and
    an encoder coupled upstream of the sampling means, the at least one error signal being applied to the encoder in the calibration state, the encoder providing an encoder signal indicating whether one of the feedback signal and the input signal leads the other one of the feedback signal and the input signal or whether one of the feedback signal and the input signal lags the other one of the feedback signal and the input signal.

2. The phase-locked loop circuit according to claim 1, further comprising a feedback divider being suitable for providing the feedback signal, the output signal being applied to the feedback divider.

3. The phase-locked loop circuit according to claim 1, further comprising:
    a first switch coupled between the loop filter and the oscillator, the first switch being in a conductive state during the normal operation state and being in a non-conductive state during the calibration state,
    a second switch coupled between the oscillator and a circuit or terminal for providing a reference signal, the second switch being in a non-conductive state during the normal operation state and being in a conductive state during the calibration state.

4. The phase-locked loop circuit according to claim 1, wherein the at least one error signal comprises:
    a first error signal indicating whether and to what extent one of the feedback signal and the input signal lags the other one of the feedback signal and the input signal and
    a second error signal indicating whether and to what extent one of the feedback signal and the input signal leads the other one of the feedback signal and the input signal.

5. The phase-locked loop circuit according to claim 1, wherein the state machine is suitable for providing the sequence of control words and selecting the trim setting on the basis of whether one of the feedback signal and the input signal leads the other one of the feedback signal and the input signal or whether one of the feedback signal and the input signal lags the other one of the feedback signal and the input signal.

6. The phase-locked loop circuit according to claim 1, wherein the encoder has a first encoder input, a second encoder input, a first encoder output and a second encoder output, the first encoder output providing a logical HIGH signal if a logical HIGH signal is applied to either the first encoder input or the second encoder input, the second encoder output providing a logical HIGH signal if a logical HIGH signal is applied to a given one of the first and second encoder inputs.

7. The phase-locked loop circuit according to claim 6, wherein the signal generator is coupled to the first encoder output, the signal generator being suitable for providing the signal on the basis of an applied signal in such a manner that it is delayed and has a larger pulse interval.

8. The phase-locked loop circuit according to claim 1, wherein the sampling means comprises a D flip-flop for sampling the encoder signal provided at the second encoder output.

9. The phase-locked loop circuit according to claim 1, further comprising a first multiplexer and a second multiplexer coupled upstream of the first and second encoder inputs, the first and second multiplexers providing the first and second error signals in the calibration state.

10. The phase-locked loop circuit according to claim 1, being suitable for switching to the calibration state in response to a start signal wherein:
    the first switch switches to the non-conductive state, the second switch switches to the conductive state, and
    the state machine starts trimming.

11. The phase-locked loop circuit according to claim 1, being suitable for switching to the normal operation state in response to an end signal, wherein:
    the first switch switches to the conductive state, the second switch switches to the non-conductive state, and the selected trimming set is fixed for use in the normal operation state.

12. An audio-chip comprising the phase-locked loop circuit according to claim 1.

13. An active noise canceling chip comprising the phase-locked loop circuit according to claim 1.

14. An optical device comprising the phase-locked loop circuit according to claim 1.

* * * * *